United States Patent
Takahashi

(10) Patent No.: US 9,947,866 B2
(45) Date of Patent: Apr. 17, 2018

(54) NONVOLATILE MEMORY DEVICE MANUFACTURING METHOD

(71) Applicant: TOSHIBA MEMORY CORPORATION, Tokyo (JP)

(72) Inventor: Kensuke Takahashi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 44 days.

(21) Appl. No.: 15/253,603

(22) Filed: Aug. 31, 2016

(65) Prior Publication Data

US 2017/0077100 A1 Mar. 16, 2017

(30) Foreign Application Priority Data

Sep. 11, 2015 (JP) .................. 2015-180079

(51) Int. Cl.
| | |
|---|---|
| H01L 21/44 | (2006.01) |
| H01L 45/00 | (2006.01) |
| H01L 27/24 | (2006.01) |

(52) U.S. Cl.
CPC ........ *H01L 45/085* (2013.01); *H01L 27/2481* (2013.01); *H01L 45/1233* (2013.01);
(Continued)

(58) Field of Classification Search
CPC .............. H01L 45/085; H01L 45/04; H01L 45/12–45/1253; H01L 45/1266–45/14; H01L 45/145–45/1691; H01L 27/2481; H01L 27/24; H01L 27/2463–27/249; G11C 13/0011; G11C 11/5614;
(Continued)

(56) References Cited

U.S. PATENT DOCUMENTS

| | | |
|---|---|---|
| 8,551,853 B2 | 10/2013 | Tsuji et al. |
| 8,822,966 B2 | 9/2014 | Takahashi et al. |

(Continued)

FOREIGN PATENT DOCUMENTS

| | | |
|---|---|---|
| JP | 2008-305888 | 12/2008 |
| JP | 2014-017379 | 1/2014 |

(Continued)

OTHER PUBLICATIONS

Dabanjan Jana, Et al. Conductive-bridging ramdom access memory: challenges and opportunity for 3D architecture, Nanoscale Research Latters, (2015) pp. 1-23.*

*Primary Examiner* — Tod T Van Roy
*Assistant Examiner* — Delma R Forde
(74) *Attorney, Agent, or Firm* — Patterson & Sheridan, LLP

(57) ABSTRACT

A method of manufacturing a nonvolatile memory device includes sequentially forming, on a first wiring layer extending in a first direction, a first layer containing a first metal and a second layer containing a second metal into which the first metal can diffuse. The method further includes oxidizing the first layer and the second layer, removing oxygen from the oxidized first layer by annealing, forming a conductive third layer on the oxidized second layer after removing oxygen from the oxidized first layer, and forming a second wiring layer on the third layer. The second wiring layer extends in a second direction crossing the first wiring layer.

19 Claims, 7 Drawing Sheets

(52) U.S. Cl.
CPC ........ *H01L 45/1266* (2013.01); *H01L 45/146* (2013.01); *H01L 45/1608* (2013.01); *H01L 45/1675* (2013.01)

(58) Field of Classification Search
CPC .............. G11C 14/0045; G11C 14/009; G11C 2213/34; G11C 2213/52
See application file for complete search history.

(56) References Cited

U.S. PATENT DOCUMENTS

| | | | |
|---|---|---|---|
| 8,871,561 B2 | 10/2014 | Takahashi et al. | |
| 2007/0258170 A1* | 11/2007 | Yuasa | H01L 43/08 360/324.2 |
| 2008/0185572 A1* | 8/2008 | Chiang | H01L 45/1633 257/4 |
| 2011/0193050 A1* | 8/2011 | Takano | H01L 27/2409 257/4 |
| 2012/0217461 A1* | 8/2012 | Kobayashi | H01L 45/08 257/2 |
| 2013/0234095 A1* | 9/2013 | Baba | H01L 45/085 257/4 |
| 2014/0063912 A1* | 3/2014 | Aiga | H01L 45/08 365/148 |
| 2014/0170830 A1* | 6/2014 | Lee | H01L 45/145 438/382 |
| 2014/0299830 A1* | 10/2014 | Kim | H01L 45/08 257/4 |

FOREIGN PATENT DOCUMENTS

| | | |
|---|---|---|
| JP | 2014-165345 | 9/2014 |
| WO | 2012/005003 | 1/2012 |
| WO | 2012/105225 | 8/2012 |

\* cited by examiner

NONVOLATILE MEMORY DEVICE MANUFACTURING METHOD

CROSS-REFERENCE TO RELATED APPLICATION

This application is based upon and claims the benefit of priority from Japanese Patent Application No. 2015-180079, filed Sep. 11, 2015, the entire contents of which are incorporated herein by reference.

FIELD

Embodiments described herein relate to a method of manufacturing a nonvolatile memory device.

BACKGROUND

A cross-point type memory device including a variable resistance element in a memory cell has been recognized as a large capacity, nonvolatile memory device. In particular, a Conductive Bridging Random Access Memory (CBRAM), which is a cross-point type memory device, can be formed with a general semiconductor process and material. The CBRAM is attracting attention as a nonvolatile memory device of the next generation because writing current and erasing current are very small and data holding performance is high.

Since the CBRAM has a simple structure, it may be easily formed in a stereoscopic structure. When manufacturing a stereoscopic CBRAM, word lines and bit lines are alternately arranged in the stacking (vertical) direction and each memory cell is arranged between each word line and vertically adjacent bit line. For example, the stacking order of each layer within a memory cell arranged between a word line and a bit line is opposite to the stacking order of each layer within a memory cell arranged between the word line and a bit line arranged under the word line.

With such a stacking order, even when the material of each layer forming each memory cell is common in all the memory cells, the order of arranging each layer is opposite and the film formation condition is not the same. With the advance in miniaturization, each layer forming a memory cell has to be thin, and when the stacking order changes, there is a fear that the quality of film cannot be consistently maintained in each layer.

DETAILED DESCRIPTION

One embodiment provides a method of manufacturing a nonvolatile memory device capable of suppressing degradation of film quality in a simple manufacturing process even when forming in a stereoscopic structure.

In general, according to one embodiment, a method of manufacturing a nonvolatile memory device includes sequentially forming, on a first wiring layer that extends in a first direction, a first layer containing a first metal and a second layer containing a second metal into which the first metal can diffuse. The method further includes oxidizing the first layer and the second layer, selectively removing oxygen from the oxidized first layer by annealing, and forming a conductive third layer on the oxidized second layer after selectively removing oxygen from the oxidized first layer, and forming a second wiring layer on the third layer. The second wiring layer extends in a second direction crossing the first direction.

Figure 1:
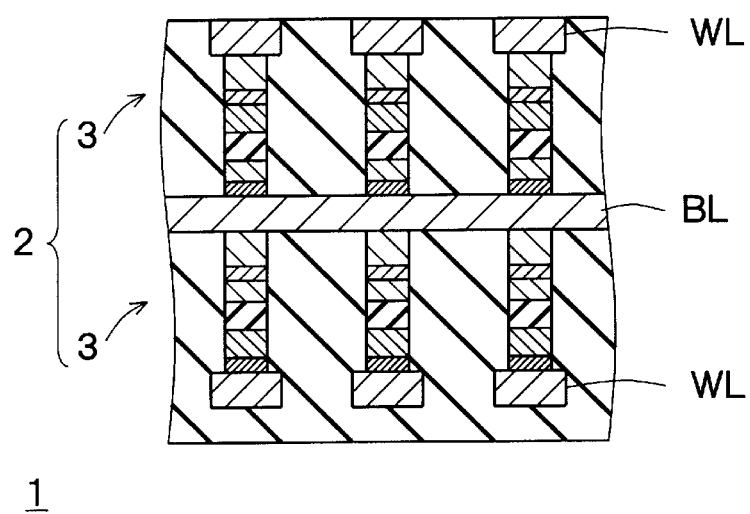
FIG. 1 is a view showing a cross sectional structure of a memory cell array of a nonvolatile memory device according to one embodiment.

Exemplary embodiments will be described with reference to the drawings. FIG. 1 is a view showing a cross sectional structure of a memory cell array 2 in a nonvolatile memory device 1 according to one embodiment, and FIG. 2 is a schematic perspective view of the memory cell array 2 in the nonvolatile memory device 1 according to the embodiment.

Figure 2:
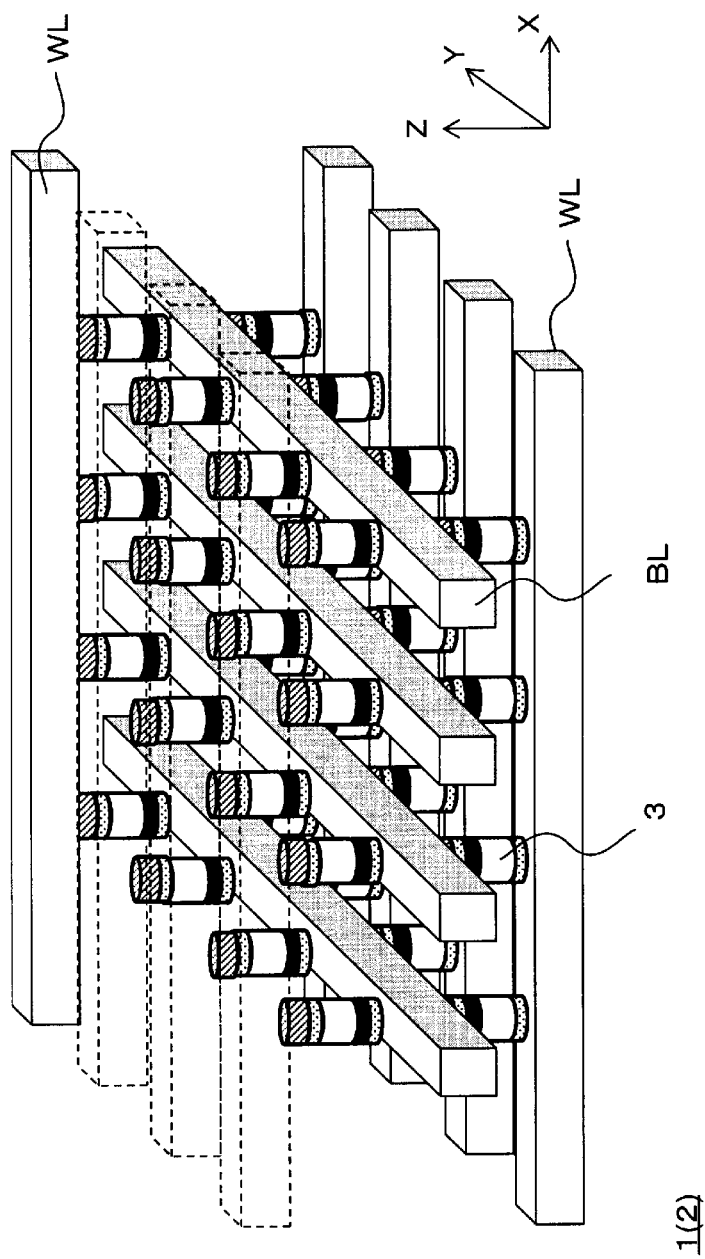
FIG. 2 is a schematic perspective view of the memory cell array of the nonvolatile memory device according to the embodiment.

The memory cell array 2 in FIG. 2 is a cross-point type memory unit. The memory cell array 2 in FIG. 2 is arranged, for example, on a silicon substrate, not illustrated. On the silicon substrate, a drive circuit, not illustrated, for driving the memory cell array 2 is arranged. On the drive circuit, the memory cell array 2 of FIG. 2 is arranged with an interlayer insulating film made of a silicon oxide film interposed therebetween.

The memory cell array 2 of FIG. 2 includes word lines WL and bit lines BL driven by the drive circuit. The word lines WL and the bit lines BL are formed, for example, using tungsten. The word lines WL and the bit lines BL are arranged alternately in the vertical direction (z direction) at a predetermined interval. The word line WL extends, for example, in the X direction and the respective word lines WL are arranged at a predetermined interval in the Y direction. The bit line BL extends, for example, in the Y direction and the respective bit lines BL are arranged at a predetermined interval in the X direction. In this manner, the word lines WL and the bit lines BL are arranged in a direction crossing each other.

At each crossing of the word line WL and the bit line BL which are adjacent in the Z direction, a memory cell 3 is arranged. FIG. 1 shows an example with three memory cells 3 arranged between the center bit line BL and three word lines WL thereon and three memory cells 3 arranged between the center bit line BL and three word lines WL thereunder.

FIG. 2 shows an example of two-layered structure of the memory cells 3 with one upper layer of the word lines WL above the bit lines BL and one lower layer of the word lines WL below the bit lines BL, but the number of the layers of the memory cells 3 is arbitrary and the number of the word lines WL and the bit lines BL in the XY direction is arbitrary.

Figure 3A:
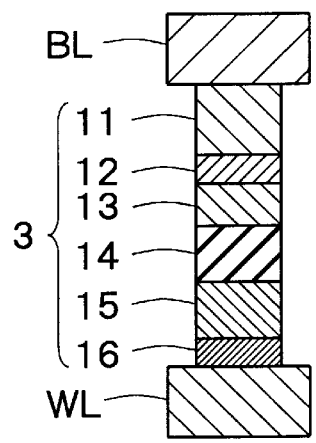
FIG. 3A is an enlarged view of the cross sectional structure of the memory cell arranged between a bit line and a word line below the bit line, as arranged in FIG. 2.
Figure 3B:
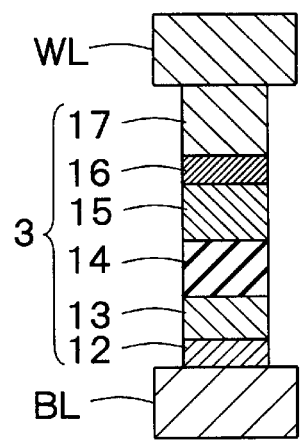
FIG. 3B is an enlarged view of the cross sectional structure of the memory cell arranged between the bit line and a word line above the bit line, as arranged in FIG. 2.

The memory cell 3 according to the embodiment is a nonvolatile resistance change type memory cell called CBRAM. FIG. 3A is an enlarged view of the cross sectional structure of the memory cell 3 arranged between the bit line BL and the word line WL below the bit line, as arranged in FIG. 2. FIG. 3B is an enlarged view of the cross sectional structure of the memory cell 3 arranged between the bit line BL and the word line WL above the bit line, as arranged in FIG. 2.

The memory cell 3 according to the embodiment is a variable resistance element having a resistance change layer (also referred to as an ion diffusion layer) that reversibly changes between a high resistance state and a low resistance state in response to the movement of metal ions.

The memory cell 3 in FIG. 3A is formed in a structure of stacking a bit line contact metal layer (twelfth layer) 11, a barrier metal layer (eleventh layer) 12, an ion source electrode (sixth layer) 13, an ion diffusion layer (fifth layer) 14, a counter electrode (fourth layer) 15, and a barrier metal layer (tenth layer) 16 between the bit line BL and the word line WL thereunder, sequentially from the side of the bit line.

The memory cell 3 in FIG. 3B is, for example, a memory cell arranged just under the word line WL in FIG. 3A. The memory cell 3 in FIG. 3B is formed in a structure of stacking a word line contact metal layer (ninth layer) 17, the barrier metal layer (eighth layer) 16, the counter electrode (third layer) 15, the ion diffusion layer (second layer) 14, the ion source electrode (first layer) 13, and the barrier metal layer (seventh layer) 12 between the bit line BL and the word line WL thereabove sequentially from the side of the word line.

In this manner, part of the stacking order is reversed in the memory cell 3 (FIG. 3A) arranged under the bit line BL and in the memory cell 3 (FIG. 3B) arranged above the bit line BL. Here, one of the bit line BL and the word line WL is the first wiring layer and the other is the second wiring layer.

The ion source electrode 13 within the memory cell 3 includes at least one metal element (first metal) selected from, for example, a group of copper (Cu), silver (Ag), aluminum (Al), cobalt (Co), and nickel (Ni). In most cases, it is an element which does not react with silicon, a silicon oxide film, or a transition metal oxide film. Suitable elements are those that, if oxidized, can eliminate oxygen under thermal treatment. The thermal oxide decomposition temperature of the ion source electrode 13 is lower than the thermal oxide decomposition temperature of the ion diffusion layer 14. An element whose oxide can decompose into metal and oxygen at a temperature of 350° C. and lower in an atmosphere with oxygen partial pressure of 1 atm is useful in the ion source electrode.

The ion source electrode 13 is more difficult to oxidize, or has higher ionization energy (kJ/mol), than the metal element forming the ion diffusion layer 14. The ionization energy (kJ/mol) of various metals is, in descending order, Au (890)>Co (760.4)>Ta (761)>Cu (745.5)>Ni (737.1)>Ag (731)>>Ti (658.8)>Hf (658.5)>Zr (640.1)>>Al (577.5).

Oxides of the metals above have melting points as follows: $Ag_2O$ is 100-280° C., $HfO_2$ is 2758° C., $TiO_2$ is 1870° C., $Cu_2O$ is 1800° C., $ZrO_2$ is 2715° C., NiO is 1984° C., $Al_2O_3$ is 2072° C., and CoO is 1933° C.

Accordingly, from the viewpoint of the ionization energy and thermal decomposition temperature, silver Ag is suitable. The ion source electrode 13 may be a mixture containing other elements such as silicon or tungsten, or may be a stacked structure including these.

In most cases, the film thickness of the ion source electrode 13 is within the range of 1 to 10 inclusively. When the film thickness is 1 and more, for example, the above electrode can be formed with uniform thickness, for example, by vacuum evaporation or sputtering. Further, considering the processability in etching a stacked film including each layer, when the film thickness of the ion source electrode 13 is 10 nm and less, etching the film is easier. Each layer is processed, for example, by the reactive ion etching (RIE) method.

The material of the ion diffusion layer 14 is not particularly restricted, so long as the ionized metal of the ion source electrode 13 can diffuse into the ion diffusion layer 14 in the presence of an electric field. The material of the ion diffusion layer 14 maybe amorphous silicon, silicon oxide film, silicon nitride film, a transition metal oxide, or combination thereof. The ion diffusion layer 14 is typically a metal oxide film with a low diffusion coefficient for the metal material forming the ion source electrode 13 at a temperature of about 400° C. to 500° C. The metal element contained in the ion diffusion layer 14 is a second metal.

The thermal decomposition temperature of the ion diffusion layer 14 is higher than the oxide of the ion source electrode 13, preferably 1000° C. or more. The ion diffusion layer 14 may be a high dielectric constant film to reduce a voltage of cell operation and suppress a leak current. From the viewpoint of easy processability and higher capacitance, the film thickness of the ion diffusion layer 14 is typically 10 nm or less, and from the viewpoint of assuring the process uniformity, it is typically 1 nm or more. The material used for the ion diffusion layer 14 maybe selected from one of $Al_2O_3$, $HfO_2$, $Y_2O_3$, $La_2O_3$, $TiO_2$, $Ta_2O_5$, and $ZrO_2$ from the viewpoint of affinity for the process in the semiconductor manufacturing line. Further, to promote selective oxidation of the ion diffusion layer 14, the ionization energy of the ion diffusion layer 14 maybe lower than that of the element forming the ion source electrode 13. When selecting Ag as the ion source electrode 13, $Al_2O_3$, $HfO_2$, $TiO_2$, and $ZrO_2$ are good choices as the ion diffusion layer 14.

The counter electrode 15 is conductive and is made of a material that adheres to the ion diffusion layer 14. The counter electrode 15 may be a semiconductor material, for example silicon, with an N-type dopant. When electrons can be generated as the carrier, the element to be added as dopant is not particularly restricted but the dopant concentration is preferably set in the range of $1\times10^{18}$ to $1\times10^{20}$ cm$^{-3}$ in an activated state of all the elements.

Figure 4A:
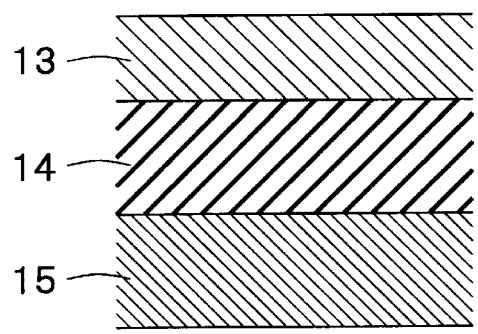
FIG. 4A is a cross-sectional view of the memory cell in the initial state.
Figure 4B:
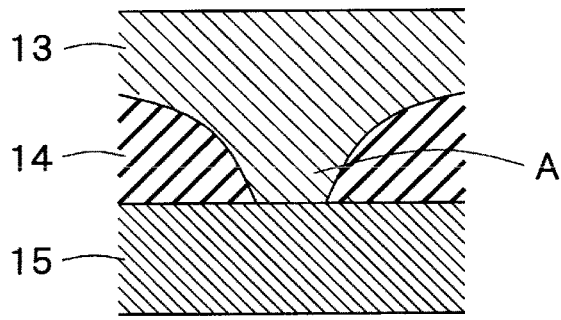
FIG. 4B is a cross-sectional view of the memory cell in the ON state.
Figure 4C:
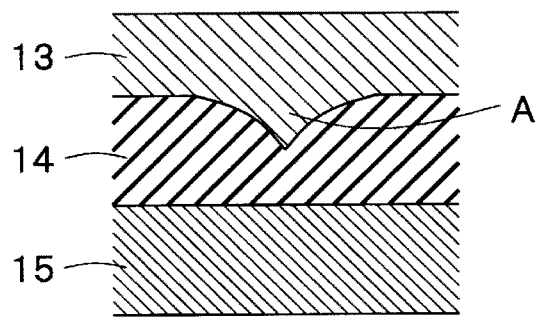
FIG. 4C is a cross-sectional view of the memory cell in the OFF state.

FIGS. 4A, 4B, and 4C are cross-sectional views each showing the operation of the memory cell 3 schematically. FIG. 4A shows the initial state of the memory cell 3, FIG. 4B shows the ON state, and FIG. 4C shows the OFF state.

In the initial state shown in FIG. 4A, metal ions are located in the ion source electrode 13 and are not present in the ion diffusion layer 14. Accordingly, there is a high resistance between the ion source electrode 13 and the counter electrode 15.

When a positive voltage (writing voltage) is applied to the ion source electrode 13 and a negative voltage is applied to the counter electrode 15, the metal ions are moved from the ion source electrode 13 to the ion diffusion layer 14. Thus, as shown in FIG. 4B, a conductive path (filament) A of metal ions is formed between the ion source electrode 13 and the counter electrode 15, and the resistance is reduced (ON) between the ion source electrode 13 and the counter electrode 15.

On the other hand, when a comparatively high voltage (reset voltage) in a reverse direction to the writing voltage is applied, the metal ions are moved in the reverse direction, and as shown in FIG. 4C, the filament A between the ion source electrode 13 and the counter electrode 15 recedes to return into the original high resistance state (OFF).

Further, in the low resistance state shown in FIG. 4B, even a comparatively low voltage in the reverse direction can interrupt the filament A and return the memory element to the high resistance state. On the contrary, when a voltage is applied in the same direction as the writing voltage, the metal ions are moved toward the direction of the counter electrode 15 to make the filament A conductive, hence to return to the low resistance state (ON).

In this manner, the memory cell 3 works as a switching element having rectifying characteristics. Further, when an n-type semiconductor is used for the counter electrode 15, the portion of the counter electrode 15 in contact with the ion diffusion layer 14 is depleted of electrons when the reverse direction voltage is applied. Therefore, since there are fewer electrons as conductive carriers in the contact point of the conductive path A and the counter electrode 15, current passing through the filament A is small and strong rectifying characteristics can be obtained.

When using the n-type semiconductor as the counter electrode 15, a low dopant concentration can reduce the effects of depletion. However, when using low dopant concentration, miniaturization drives larger variability in dopant concentration. Therefore, depending on the size of the memory cell 3, it is preferable that the semiconductor material and the dopant concentration should be properly selected.

As mentioned above, the memory cell 3 is a voltage operation type variable resistance element in which operation current is typically small. When in the OFF state, the filament A is physically broken off and the data holding performance is high.

When forming the cross-point type memory cell array 2 using the memory cell 3 having the rectifying characteristics, a rectifying element (such as a diode) can prevent a false change to an unintended cell. Thus, the structure of the memory cell 3 can be simplified.

As shown in FIGS. 3A and 3B, in the memory cell array 2 in the stereoscopic structure, portions of the stacking order are reversed in the memory cell 3 arranged above the bit line BL and in the memory cell 3 arranged under the bit line. When using Ag as the ion source electrode 13, depositing Ag as a thin film, and forming the ion diffusion layer 14 on the thin Ag film as in FIG. 3B, is difficult. On the other hand, in the case of the memory cell 3 in FIG. 3A, the ion source electrode 13 is arranged on the ion diffusion layer 14 and the barrier metal layer 12 is arranged on the ion source electrode 13, so the thin Ag ion source electrode 13 and the barrier metal layer 12 can be formed stably. In the embodiment, as described later, by making the manufacturing method of the memory cell 3 in FIG. 3B different from the manufacturing method of the memory cell 3 in FIG. 3A, degradation in the film quality of each layer is suppressed in the both memory cells 3.

FIGS. 5A to 5E are cross-sectional views of a substrate at various stages of the manufacturing process of the memory cell 3 in FIG. 3A, schematically showing a portion of the substrate in each process.

Figure 5A:
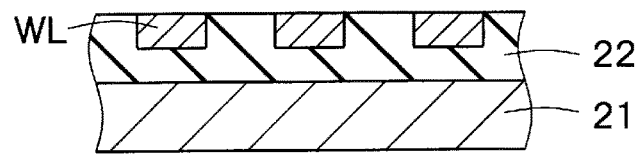
FIG. 5A is a cross-sectional view of a substrate at one stage of a manufacturing process of the memory cell in FIG. 3A.

For example, as shown in FIG. 5A, an interlayer insulating film 22 is formed on a silicon substrate 21 and word lines WL are formed thereon. A drive circuit, not illustrated, may be formed on the surface of the silicon substrate 21. In the following drawings, the silicon substrate 21 is omitted.

The interlayer insulating film 22 is a silicon oxide film formed, for example, by the chemical vapor deposition (CVD) method. For example, a tungsten (W) film with a thickness of 30 to 50 nm formed by the CVD method can be used for the word line WL. The word line WL is formed by processing the W film using, for example, the RIE and the damascene method.

Figure 5B:
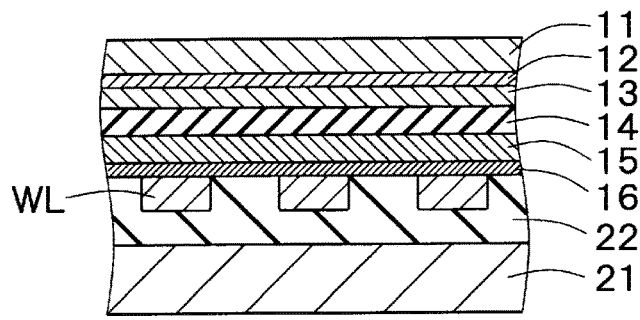
FIG. 5B is a cross-sectional view of a substrate in another stage of the manufacturing process of the memory cell in FIG. 3A.

Then, as shown in FIG. 5B, the barrier metal layer 16, the counter electrode 15, the ion diffusion layer 14, the ion source electrode 13, the barrier metal layer 12, and the contact metal layer 11 are sequentially formed on the word lines WL. This stacked structure can be formed, for example, using the sputtering.

As the barrier metal layer 16, for example, a metal selected from a group of ruthenium Ru, titanium Ti, tantalum Ta, tungsten W, hafnium Hf, and aluminum Al or the oxide thereof or a material selected from the nitride thereof can be used. From the viewpoint of resistance in the memory cell 3, writing voltage, and the process resistance, TiN is suitable with a thickness in the range of 5 nm to 15 nm.

As the ion source electrode 13, silver Ag is used. As the ion diffusion layer 14, transition metal oxide such as $Al_2O_3$, $HfO_2$, $TiO_2$, and $ZrO_2$ is used.

Figure 5C:
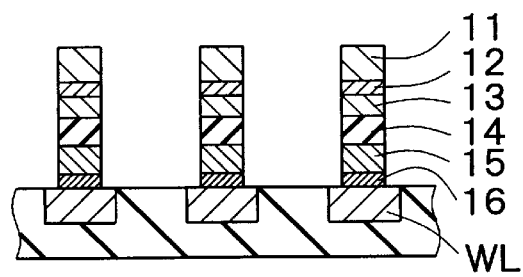
FIG. 5C is a cross-sectional view of a substrate in another stage of the manufacturing process of the memory cell in FIG. 3A.

Consequently, as shown in FIG. 5C, the stacked structure of the barrier metal layer 16 to the contact metal layer 11 is selectively etched, hence to form the memory cells 3. For example, a mask material is formed on the stacked structure, and after processing the above into a cell pattern by photo lithography, the stacked structure is etched into, for example, pillar shapes of width 20 to 100 nm by the RIE method.

Figure 5D:
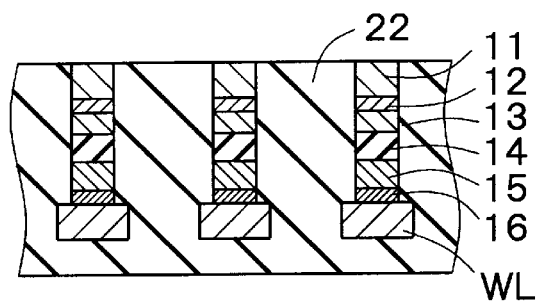
FIG. 5D is a cross-sectional view of a substrate in another stage of the manufacturing process of the memory cell in FIG. 3A.

As shown in FIG. 5D, the interlayer insulating film 22 is formed in the spaces between the memory cells 3. The interlayer insulating film 22 is, for example, a silicon oxide film formed by the CVD method with a thickness enough to bury the whole memory cells 3. Further, the surface of the interlayer insulating film 22 is flattened by the chemical mechanical polish (CMP) method, to expose the top surfaces of the contact metal layers 11. The contact metal layer 11 is formed thicker than the other layers, for example, with a thickness of 30 to 50 nm; therefore, the contact surface can be exposed without damaging the memory cell 3.

Figure 5E:
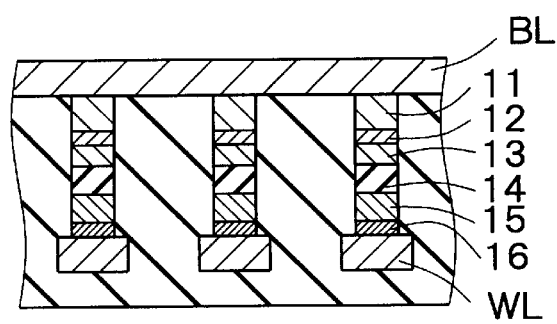
FIG. 5E is a cross-sectional view of a substrate in another stage of the manufacturing process of the memory cell in FIG. 3A.

As shown in FIG. 5E, the bit line BL is formed on the contact metal layer 11. For example, the W film is formed on the interlayer insulating film 22 by the CVD method and patterned by the RIE method. Thereby, a plurality of bit lines BL are formed extending on the interlayer insulating film 22 in contact with the contact metal layer 11. Further, the interlayer insulating material subsequently formed over the bit lines BL (not illustrated) is embedded in the spaces between the bit lines BL.

Then, the memory cell 3 (FIG. 3B), as a second step in the memory cell array 2, is formed. FIGS. 6A to 6G are cross-sectional views of a substrate at various stages of the manufacturing process of the memory cell 3 shown in FIG. 3B.

Figure 6A:
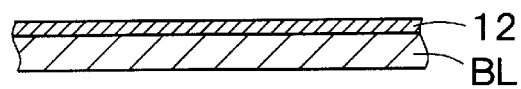
FIG. 6A is a cross-sectional view of a substrate in one stage of the manufacturing process of the memory cell in FIG. 3B.

As shown in FIG. 6A, the bit line BL and the barrier metal layer 12 are sequentially formed. As the barrier metal layer 12, a metal selected from a group of ruthenium Ru, titanium Ti, tantalum Ta, tungsten W, hafnium Hf, and aluminum Al, or the oxide thereof, or the nitride thereof can be used; TiN is a suitable barrier material, with a film thickness preferably in the range of 5 nm to 15 nm.

Figure 6B:
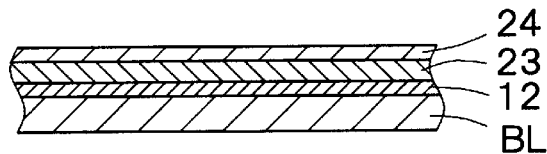
FIG. 6B is a cross-sectional view of a substrate in another stage of the manufacturing process of the memory cell in FIG. 3B.

Then, as shown in FIG. 6B, a thin film 23 of silver Ag is formed as the ion source electrode 13, and an ion source electrode cap film 24 is also formed on the ion source electrode 13. Forming a thin film of silver Ag is difficult; however, by forming the ion source electrode cap film 24, made of a conductive material, on the silver Ag film, a thin film of the silver Ag can be formed between the bit line BL and the ion source electrode cap film 24.

The ion source electrode cap film 24 is made of a metal element that is eventually incorporated in the ion diffusion layer 14, for example selected from aluminum Al, hafnium Hf, titanium Ti, and zinc Zn.

Figure 6C:
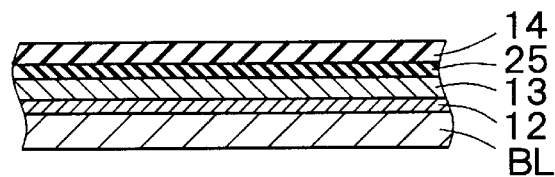
FIG. 6C is a cross-sectional view of a substrate in another stage of the manufacturing process of the memory cell in FIG. 3B.

As shown in FIG. 6C, the ion source electrode cap film 24 is additionally oxidized to form the ion diffusion layer 14. In the additional oxidation, the ion source electrode cap film 24 maybe heated in an oxygen atmosphere or oxidized using oxygen plasma and/or oxygen radicals at a low temperature.

During the process of oxidation of forming the ion diffusion layer 14 from the ion source electrode cap film 24, oxygen passes through the ion diffusion layer 14 and as shown in FIG. 6C, an ion source metal oxide 25 is formed in the interface between the ion source electrode 13 and the ion diffusion layer 14.

Figure 6D:
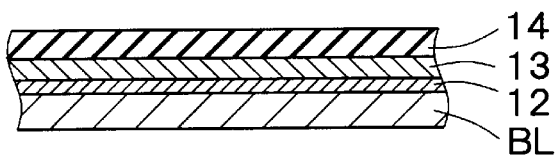
FIG. 6D is a cross-sectional view of a substrate in another stage of the manufacturing process of the memory cell in FIG. 3B.

As shown in FIG. 6C, the ion source metal oxide 25 is thermally decomposed through annealing. The annealing temperature is in a range in which the ion diffusion layer 14 formed on the ion source electrode 13 is not thermally decomposed and the interface characteristics between the ion source electrode 13 and the barrier metal layer 12 thereunder or the bit line BL thereunder and the electric characteristics of the bulk are not degraded. In one example, the temperature is set at 350° C. or less. When silver Ag is used as the ion source electrode 13, the silver oxide $Ag_2O$ formed from oxidizing the ion source electrode cap film is reduced to metal silver at 200° C. or higher even in a pure oxygen atmosphere at high pressure. As a result, only the oxide of silver Ag is selectively decomposed; therefore, as shown in FIG. 6D, the stacked structure of the ion source electrode 13 and the ion diffusion layer 14 with favorable interface characteristics can be formed.

Figure 6E:
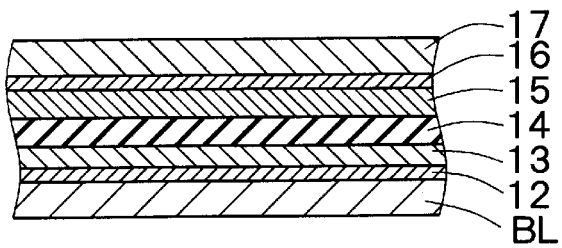
FIG. 6E is a cross-sectional view of a substrate in another stage of the manufacturing process of the memory cell in FIG. 3B.
Figure 6F:
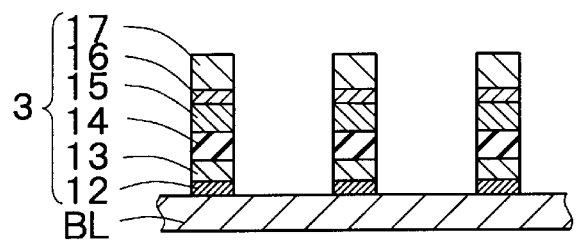
FIG. 6F is a cross-sectional view of a substrate in another stage of the manufacturing process of the memory cell in FIG. 3B.
Figure 6G:
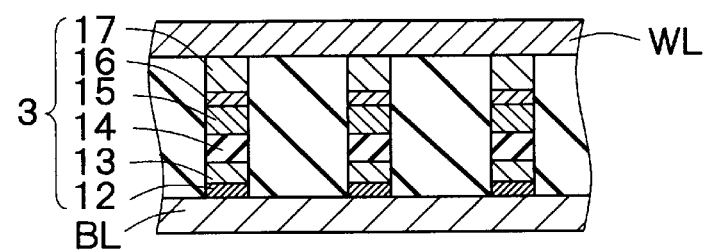
FIG. 6G is a cross-sectional view of a substrate in another stage of the manufacturing process of the memory cell in FIG. 3B.

Next, as shown in FIG. 6E, the counter electrode 15, the barrier metal layer 16, and the contact metal layer 17 are sequentially formed on the ion diffusion layer 14. Thereafter, as shown in FIG. 6F, each layer is etched by the RIE, to form the memory cells 3. As shown in FIG. 6G, the interlayer insulating film 9 is embedded in the spaces between the cells and after flattening by the CMP technique, the word lines WL2 are formed, and then, the memory cells 3 in the third layer are formed. The memory cells 3 of the third layer are manufactured by the same method as shown in FIGS. 5A to 5E and formed in the same layer structure as FIG. 3A.

Accordingly, in the embodiment, when using silver Ag as the material of the ion source electrode 13 within the memory cell 3, although it is difficult to arrange the insulating ion diffusion layer 14 directly thereon, the ion source electrode cap film 24 made of the conductive material can be formed on the silver Ag and oxidized to form the ion diffusion layer 14. A portion of the silver Ag thereunder is oxidized, but the oxygen can be removed from the silver by annealing to reduce the silver Ag. Thus, the ion diffusion layer 14 using a different metal oxide can be formed on the silver ion source electrode 13. According to the embodiment, while portions of the stacking order of the resistance change type memory cell 3 are reversed in the vertical direction, a stereoscopic memory cell array 2 can be formed without deteriorating the film quality of each layer.

Here, the arrangement of the word lines WL and the bit lines BL in the memory cell 3 in FIG. 3A may be reversed. Similarly, the arrangement of the word lines WL and the bit lines BL in the memory cell 3 in FIG. 3B may be reversed. Similarly, in FIGS. 1 and 2, the arrangement of the word lines WL and the bit lines BL shown in FIGS. 1 and 2 maybe reversed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile memory device comprising:
    sequentially forming, on a first wiring layer that extends in a first direction, a first layer containing a first metal and a second layer containing a second metal into which the first metal can diffuse;
    oxidizing the first layer and the second layer;
    selectively removing oxygen from the oxidized first layer by annealing;
    forming a conductive third layer on the oxidized second layer after selectively removing oxygen from the oxidized first layer; and
    forming a second wiring layer on the third layer, the second wiring layer extending in a second direction crossing the first direction.

2. The method according to claim 1, further comprising:
    forming a third wiring layer extending in a third direction crossing the first direction;
    forming a conductive fourth layer on the third wiring layer; and
    sequentially forming, on the fourth layer, a fifth layer containing the second metal and a sixth layer containing the first metal,
    wherein the first wiring layer is formed on the sixth layer.

3. The method according to claim 2, further comprising:
    forming a conductive seventh layer on the first wiring layer;
    forming a conductive eighth layer on the third layer;

forming a conductive ninth layer on the eighth layer;
forming the first layer and the second layer on the seventh layer; and
forming the second wiring layer on the ninth layer.

4. The method according to claim 3, further comprising:
forming a conductive tenth layer on the third wiring layer;
forming the fourth layer on the tenth layer;
forming a conductive eleventh layer on the sixth layer;
forming a conductive twelfth layer on the eleventh layer; and
forming the first wiring layer on the twelfth layer.

5. The method according to claim 1, wherein:
the first metal is higher than the second metal in ionization energy, and
thermal decomposition temperature of oxide of the first metal is lower than that of the second metal.

6. The method according to claim 5, wherein:
the thermal decomposition temperature of the oxide of the first metal is 280° C. or less,
the thermal decomposition temperature of the oxide of the second metal is 1000° C. or more, and
a temperature of the annealing is 300° C. or more.

7. The method according to claim 1, wherein the first metal is silver.

8. The method according to claim 7, wherein the second metal is aluminum, hafnium, titanium, or zinc.

9. A method of manufacturing a nonvolatile memory device comprising:
sequentially forming, on a first wiring layer that extends in a first direction, a first layer containing a first metal and a second layer containing a second metal into which the first metal can diffuse;
oxidizing the first layer and the second layer;
selectively removing oxygen from the oxidized first layer by annealing;
forming a conductive third layer on the oxidized second layer after selectively removing oxygen from the oxidized first layer; and
forming a second wiring layer on the third layer, the second wiring layer extending in a second direction crossing the first direction,
wherein the thermal decomposition temperature of the oxide of the first metal is lower than the thermal decomposition temperature of the oxide of the second metal.

10. The method according to claim 9, wherein the first metal is silver.

11. The method according to claim 10, wherein the second metal is aluminum, hafnium, titanium, or zinc.

12. The method according to claim 11, further comprising:
forming a third wiring layer extending in a third direction crossing the first direction;
forming a conductive fourth layer on the third wiring layer; and
sequentially forming, on the fourth layer, a fifth layer containing the second metal and a sixth layer containing the first metal,
wherein the first wiring layer is formed on the sixth layer.

13. The method according to claim 12, wherein a temperature of the annealing is 300° C. or more.

14. The method according to claim 9, wherein a temperature of the annealing is 200° C. or more.

15. The method according to claim 9, further comprising:
forming a third wiring layer extending in a third direction crossing the first direction; and
forming a conductive fourth layer on the third wiring layer;
sequentially forming, on the fourth layer, a fifth layer containing the second metal and a sixth layer containing the first metal,
wherein the first wiring layer is formed on the sixth layer.

16. The method according to claim 15, further comprising:
forming a conductive seventh layer on the first wiring layer;
forming a conductive eighth layer on the third layer;
forming a conductive ninth layer on the eighth layer;
forming the first layer and the second layer on the seventh layer; and
forming the second wiring layer on the ninth layer.

17. The method according to claim 16, further comprising:
forming a conductive tenth layer on the third wiring layer;
forming the fourth layer on the tenth layer;
forming a conductive eleventh layer on the sixth layer;
forming a conductive twelfth layer on the eleventh layer; and
forming the first wiring layer on the twelfth layer.

18. A method of manufacturing a nonvolatile memory device comprising:
sequentially forming, on a first wiring layer that extends in a first direction, a first layer containing a first metal and a second layer containing a second metal into which the first metal can diffuse;
oxidizing the first layer and the second layer;
selectively removing oxygen from the oxidized first layer by annealing at a temperature of 300° C. or more;
forming a conductive third layer on the oxidized second layer after selectively removing oxygen from the oxidized first layer; and
forming a second wiring layer on the third layer, the second wiring layer extending in a second direction crossing the first direction, wherein:
the thermal decomposition temperature of the oxide of the first metal is 280° C. or less, and
the thermal decomposition temperature of the oxide of the second metal is 1000° C. or more.

19. The method according to claim 18, further comprising:
forming a third wiring layer extending in a third direction crossing the first direction;
forming a conductive fourth layer on the third wiring layer;
sequentially forming, on the fourth layer, a fifth layer containing the second metal and a sixth layer containing the first metal,
wherein the first wiring layer is formed on the sixth layer.

* * * * *